(12) United States Patent
Lim et al.

(10) Patent No.: US 10,419,004 B2
(45) Date of Patent: Sep. 17, 2019

(54) NVFF MONOTONIC COUNTER AND METHOD OF IMPLEMENTING SAME

(71) Applicant: WINBOND ELECTRONICS CORPORATION, Taichung (TW)

(72) Inventors: Seow Fong Lim, Fremont, CA (US); Chi-Shun Lin, Fremont, CA (US)

(73) Assignee: Windbond Electronics Corporation, Taichung (TW)

( * ) Notice: Subject to any disclaimer, the term of this patent is extended or adjusted under 35 U.S.C. 154(b) by 67 days.

(21) Appl. No.: 15/493,173

(22) Filed: Apr. 21, 2017

(65) Prior Publication Data

US 2018/0309453 A1 Oct. 25, 2018

(51) Int. Cl.
*H03K 23/54* (2006.01)

(52) U.S. Cl.
CPC .................. *H03K 23/542* (2013.01)

(58) Field of Classification Search
CPC .................................... H03K 23/542
USPC ......................................................... 377/26
See application file for complete search history.

(56) References Cited

U.S. PATENT DOCUMENTS

| 7,003,067 | B1* | 2/2006 | Younis | H03K 23/54 377/116 |
|---|---|---|---|---|
| 7,206,217 | B2 | 4/2007 | Ohtsuka et al. | |
| 7,245,556 | B1 | 7/2007 | Pinto et al. | |
| 7,352,606 | B2* | 4/2008 | Wuidart | G01C 22/02 365/148 |
| 7,369,432 | B2 | 5/2008 | Berenbaum et al. | |
| 2013/0194862 | A1* | 8/2013 | Jung | G11C 14/00 365/158 |
| 2018/0058880 | A1* | 3/2018 | Tsai | G01C 22/006 |

FOREIGN PATENT DOCUMENTS

CN          104636684 A        5/2015

* cited by examiner

*Primary Examiner* — Dinh T Le
(74) *Attorney, Agent, or Firm* — Finnegan, Henderson, Farabow, Garrett & Dunner, LLP

(57) ABSTRACT

A monotonic counter includes a plurality of stages respectively corresponding to a plurality of counting bits of the monotonic counter. At least one of the plurality of stages is a non-volatile flip-flop (NVFF) counter that includes a plurality of NVFFs, each NVFF including a pair of non-volatile memory cells.

19 Claims, 14 Drawing Sheets

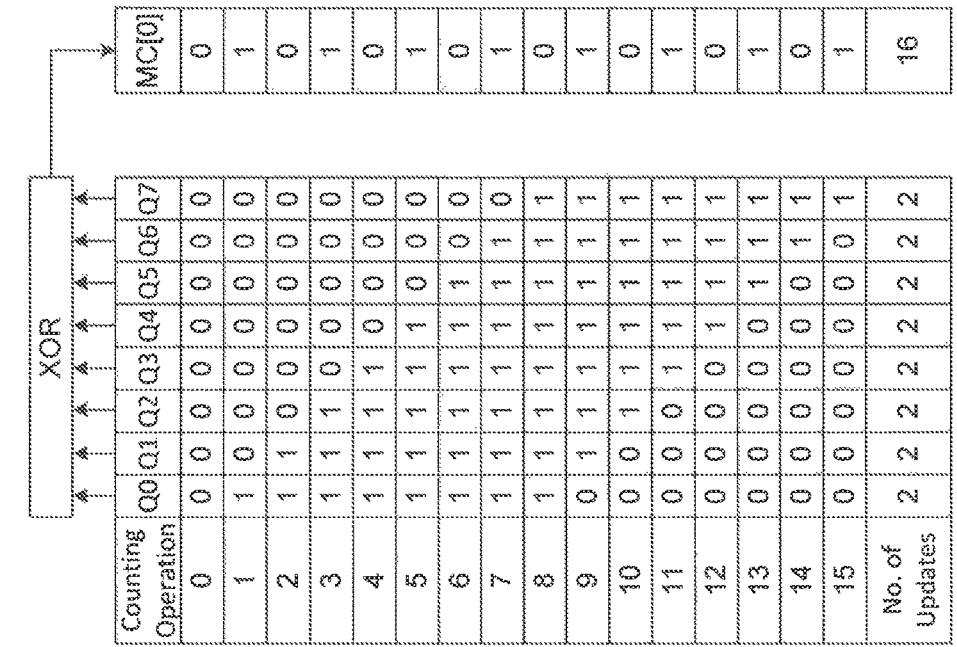

| MC[23:0] | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Updates | 2 | 4 | 8 | 16 | 32 | 64 | 128 | 256 | 512 | 1K | 2K | 4K | 8K | 16K | 32K | 64K | 128K | 256K | 512K | 1M | 2M | 4M | 8M | 16M |
| Cycles | 2 | 4 | 8 | 16 | 32 | 64 | 128 | 256 | 512 | 1K | 2K | 4K | 8K | 16K | 16K | 16K | 16K | 16K | 16K | 16K | 16K | 16K | 16K | 16K |
| # of NVFF | 1 | 1 | 1 | 1 | 1 | 1 | 1 | 1 | 1 | 1 | 1 | 1 | 1 | 1 | 2 | 4 | 8 | 16 | 32 | 64 | 16K | 128 | 512 | 1024 |

FIG. 7

| MCT[22:0] | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| Updates | 4M | 2M | 1M | 512K | 256K | 128K | 64K | 32K | 16K | 8K | 8K | 4K | 8K | 8K | 16K | 32K | 64K | 128K | 256K | 512K | 1M | 2M | 4M |
| Cycles | 16K | 16K | 16K | 16K | 16K | 16K | 16K | 16K | 16K | 8K | 8K | 4K | 8K | 8K | 16K | 16K | 16K | 16K | 16K | 16K | 16K | 16K | 16K |
| # of NVFF | 256 | 128 | 64 | 32 | 16 | 8 | 4 | 2 | 1 | 1 | 1 | 1 | 1 | 1 | 1 | 2 | 4 | 8 | 16 | 32 | 64 | 128 | 256 |

FIG. 10

| MC[23:0] | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Updates | 8M | 4M | 2M | 1M | 512K | 256K | 128K | 64K | 32K | 16K | 8K | 4K | 8K | 8K | 16K | 32K | 64K | 128K | 256K | 512K | 1M | 2M | 4M | 8M |
| Cycles | 16K | 16K | 16K | 16K | 16K | 16K | 16K | 16K | 16K | 16K | 8K | 4K | 8K | 8K | 16K | 16K | 16K | 16K | 16K | 16K | 16K | 16K | 16K | 16K |
| # of R/FF | 512 | 256 | 128 | 64 | 32 | 16 | 8 | 4 | 2 | 1 | 1 | 1 | 1 | 1 | 1 | 2 | 4 | 8 | 16 | 32 | 64 | 128 | 256 | 512 |

NVFF MONOTONIC COUNTER AND METHOD OF IMPLEMENTING SAME

FIELD OF THE DISCLOSURE

The present disclosure relates to a monotonic counter and, more particularly, to a non-volatile flip-flop (NVFF) monotonic counter and a method of implementing the NVFF monotonic counter.

BACKGROUND

A monotonic counter is a counter that provides an incremental value, and the value cannot be reversed to an old value. The monotonic counter is applied in various financial systems or electronic systems. In such applications, the monotonic counter is required to constantly update its counting value for a long period of time. In addition, the monotonic counter is required to be robust against power failure and to quickly recover its counting value when its power supply is restored.

SUMMARY

According to an embodiment of the disclosure, a monotonic counter is provided. The monotonic counter includes a plurality of stages respectively corresponding to a plurality of counting bits of the monotonic counter. At least one of the plurality of stages is a non-volatile flip-flop (NVFF) counter that includes a plurality of NVFFs, each NVFF including a pair of non-volatile memory cells.

According to another embodiment of the disclosure, a method of implementing a monotonic counter is provided. The method includes providing a plurality of stages respectively outputting a plurality of output bits, wherein at least one of the plurality of stages is a non-volatile flip-flop (NVFF) counter that includes a plurality of NVFFs, each NVFF including a pair of non-volatile memory cells, providing an output bit of one of the plurality of stages as an input clock of a next and higher-order stage of the plurality of stages, providing a pulse as an input clock of a first stage of the plurality of stages, and providing the plurality of output bits as a plurality of counting bits of the monotonic counter.

The accompanying drawings, which are incorporated in and constitute a part of this application, illustrate disclosed embodiments and, together with the description, serve to explain the disclosed embodiments.

BRIEF DESCRIPTION OF THE DRAWINGS

FIG. 1 schematically illustrates a counting scheme of a 4-bit monotonic counter.

FIG. 2 schematically illustrates a counting scheme of an 8-bit Johnson ring counter.

FIG. 7 is a summary table of the configuration of the 24-bit NVFF monotonic counter of FIG. 6.

FIG. 10 is a summary table of the configuration of the 23-bit balanced monotonic counter of FIG. 9, according to an illustrated embodiment.

FIG. 13 is a summary of the configuration of the 24-bit monotonic counter of FIG. 12, according to an illustrated embodiment.

DETAILED DESCRIPTION

Figure 3:
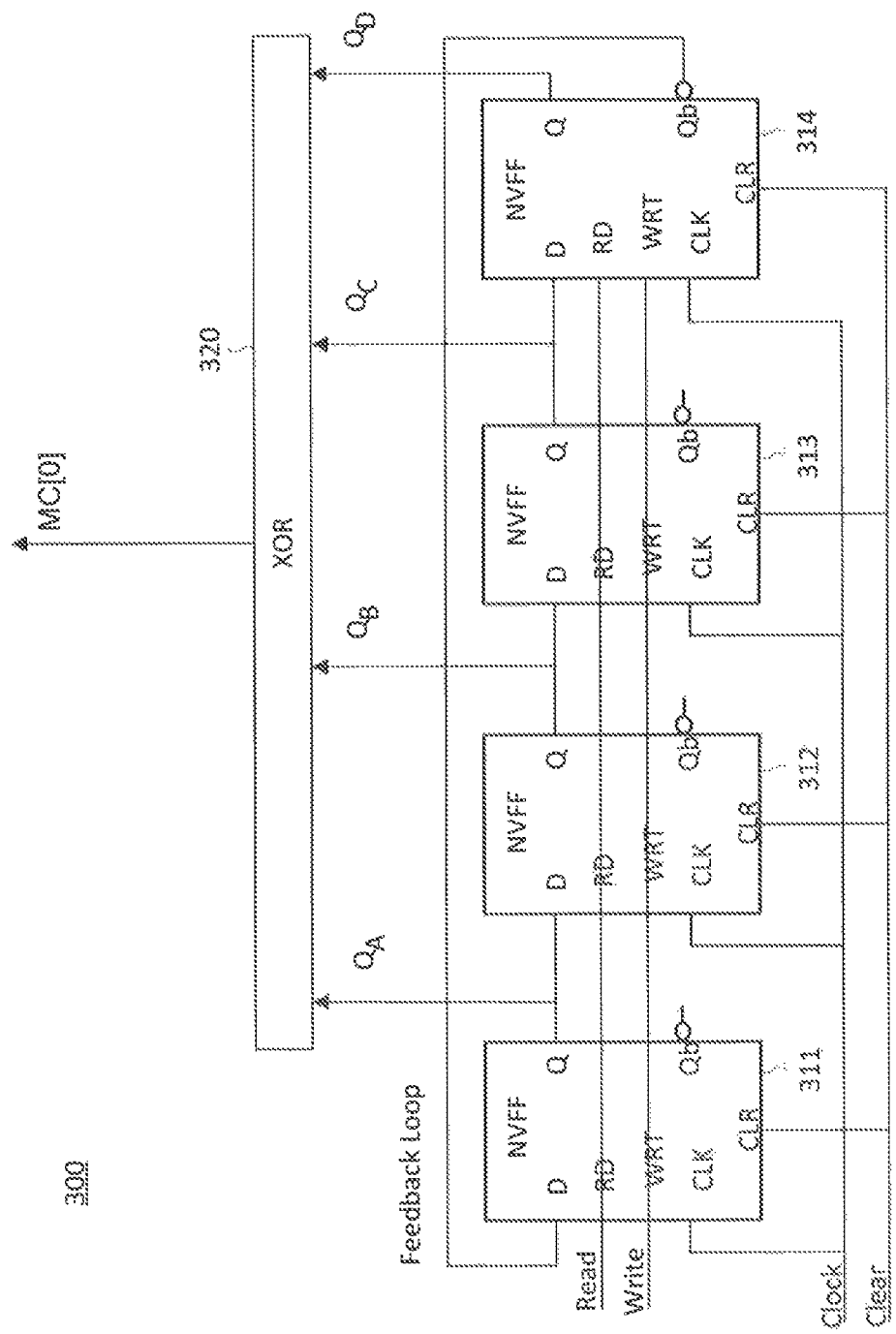
FIG. 3 schematically illustrates a circuit diagram of a 4-bit NVFF counter, according to an illustrated embodiment.

Reference will now be made in detail to the present embodiments, examples of which are illustrated in the accompanying drawings. Wherever possible, the same reference numbers will be used throughout the drawings to refer to the same or like parts.

Typically, a monotonic counter counts in binary. FIG. 1 schematically illustrates a counting scheme of a 4-bit monotonic counter 100 (hereinafter referred to as "counter 100"). Counter 100 includes four counting bits, MC[0], MC[1], MC[2], and MC[3], with MC[0] being the least significant bit (LSB) and MC[3] being the most significant bit (MSB). Each counting bit can have a logical value of "0" or "1". The counting value of counter 100 is indicated by a combination of the four counting bits, MC[0], MC[1], MC[2], and MC[3]. Thus, counter 100 can provide a maximum of 16 counts, with a counting value (in decimal) varied from 0 to 15.

Every time the counting value of counter 100 is incremented, i.e., a counting operation is performed on counter 100, at least one of the counting bits MC[0], MC[1], MC[2], and MC[3] is required to update its logical value. For example, when the counting value increases from "0" to "1" in decimal, i.e., from "0000" to "0001" in binary, MC[0] is updated from "0" to "1". As another example, when the counting value increases from "3" to "4" in decimal, i.e., from "0011" to "0100" in binary, MC[2], MC[1], and MC[0] are updated from "0", "1", and "1", to "1", "0", and "0", respectively. Accordingly, in order to provide the maximum of 16 counts, 16 updates are required for the LSB MC[0]; 8 updates are required for MC[1]; 4 updates are required for MC[2]; and 2 updates are required for MC[3]. Generally, in order for an m-bit monotonic counter including m counting bits to provide a maximum of $2^m$ counts, $2^{m-i}$ updates are required for counting bit M[i], where i=0, 1, ..., m−1, and M[0] is the LSB.

In a traditional m-bit monotonic counter including m counting bits, the logical values of the m counting bits are respectively stored in m memory cells. Every time a counting bit is updated, a program/erase cycle is required to be performed on the memory cell storing that counting bit. Since $2^m$ updates are required for the LSB M[0], $2^m$ program/erase cycles are required to be performed on the memory cell corresponding to the LSB M[0].

A monotonic counter is usually applied in financial systems or other security systems where its counting value is constantly updated for a long period of time. If a counter counts continuously for 10 years in a rate of 5 counts per seconds, the counter will provide a maximum of about 6,307,200 counts. If such a counter is implemented by the traditional m-bit monotonic counter in which the logical values of the m counting bits are respectively stored in m memory cells, about 6,307,200 program/erase cycles are required to be performed on the memory cell corresponding to the LSB MC[0]. However, a memory cell can only support around 16,000 program/erase cycles in its life, which is much less than the 6,307,200 program/erase cycles required for the LSB. Therefore, the traditional monotonic counter cannot fulfill the requirement for use in the financial systems or other security systems.

According to an embodiment of the present disclosure, at least one of the m counting bits in an m-bit monotonic counter is implemented by an n-bit ring counter. The ring counter can be a Johnson ring counter, a twisted ring counter, a gray codes counter, or a balanced gray codes counter. The n-bit ring counter includes n non-volatile flip-flops (NVFFs) respectively storing the n bits of the n-bit ring counter. Thus, the n-bit ring counter is referred hereinafter as an n-bit NVFF counter. In the n-bit NVFF counter, each NVFF includes a pair of memory cells. The memory cells can be non-volatile random access memory (RAM) cells such as, for example, resistive random access memory (ReRAM) cells, conductive bridging random access memory (CBRAM) cells, magnetoresistive random access memory (MRAM) cells, ferroelectric random access memory (FeRAM) cells, or phase change memory (PCM) cells.

FIG. 2 schematically illustrates a counting scheme of an 8-bit Johnson ring counter 200. 8-bit Johnson ring counter 200 includes eight bits, Q0, Q1, ..., Q7. Each bit can have a logical value of "0" or "1". An exclusive-OR (XOR) operation is performed on the eight bits to generate a single output bit, which can represent any one of the counting bits of a monotonic counter. In the example illustrate in FIG. 2, the single output bit of 8-bit Johnson ring counter 200 represents the counting bit MC[0] of 4-bit monotonic counter 100. In other words, the counting bit MC[0] of 4-bit monotonic counter 100 is implemented by 8-bit Johnson ring counter 200.

A counting operation of counter 200 is performed based on a Johnson ring code. For example, in counting operation No. 0, a sequence of eight bits Q0, Q1, ..., Q7, is "00000000", which, after the XOR operation, generates an output bit of "0" for MC[0]; in counting operation No. 1, the sequence of eight bits Q0, Q1, ..., Q7, becomes "10000000", which, after the XOR operation, generates an output bit of "1" for MC[0]; in counting operation No. 2, the sequence of eight bits Q0, Q1, ..., Q7, becomes "11000000", which, after the XOR operation, generates an output bit of "0" for MC[0]; and so on.

In counter 200, every time a counting operation is performed, the logical value of only one bit is required to be updated. For example, in counting operation No. 1, the logical value of bit Q0 is updated from "0" to "1"; in counting operation No. 2, the logical value of bit Q1 is updated from "0" to "1"; and so on. In this manner, counter 200 can provide 16 updates for the single output bit MC[0] by performing only two updates for each one of eight bits Q0, Q1, ..., Q7 of counter 200. If the logical values of eight bits Q0, Q1, ..., Q7 are respectively stored in eight NVFFs, only two program/erase cycles are required to be performed on each one the eight NVFFs.

As described above, according to the embodiments of the present disclosure, the n-bit NVFF counter includes n NVFFs. FIG. 3 schematically illustrates a circuit diagram of a Johnson ring counter 300 according to an illustrated embodiment. For simplicity of explanation, counter 300 includes only four bits respectively corresponding to four NVFFs. However, counter 300 can include fewer or more than four NVFFs.

As illustrated in FIG. 3, counter 300 includes four NVFFs 311, 312, 313, and 314 and an XOR gate 320. Therefore, counter 300 is also referred to herein as 4-bit NVFF counter 300. Each one of NVFFs 311, 312, 313, and 314 includes an input terminal D, a read terminal RD, a write terminal WRT, a clock terminal CLK, a clear terminal CLR, an output terminal Q, and an inverse output terminal Qb. Although not illustrated in FIG. 3, each one of NVFFs 311, 312, 313, and 314 also includes a set/reset terminal and a wordline set/reset terminal.

As illustrated in FIG. 3, NVFFs 311, 312, 313, and 314 are connected in series. Output terminals Q of NVFFs 311, 312, and 313 are connected to input terminals D of their following NVFFs 312, 313, and 314, respectively. Inverse output terminal Qb of the last one of the series-connected NVFFs, i.e., NVFF 314, is connected to input terminal D of the first one of the series-connected NVFFs, i.e., NVFF 311. A clock signal, a clear signal, a read signal, and a write signal are respectively applied to the clock terminal CLK, the clear terminal CLR, the read terminal RD, and the write terminal WRT of each one of NVFFs 311, 312, 313, and 314. The outputs $Q_A$, $Q_B$, $Q_C$, and $Q_D$ of NVFFs 311, 312, 313, and 314 are connected in parallel to XOR gate 320. XOR gate 320 generates, as an output of counter 300, a counting bit, e.g., MC[0], from outputs $Q_A$, $Q_B$, $Q_C$, and $Q_D$ of NVFFs 311, 312, 313, and 314.

Figures 4A, 4B:
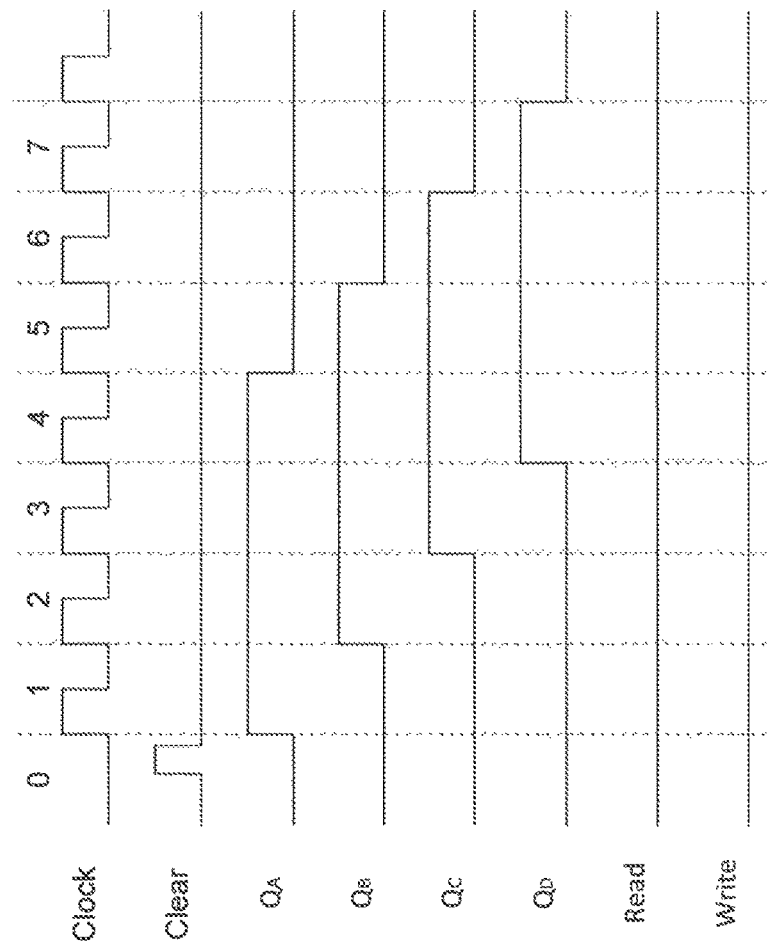
FIG. 4A is a truth table of the 4-bit NVFF counter of FIG. 3.
FIG. 4B schematically illustrates waveforms of various input and output signals of the 4-bit NVFF counter of FIG. 3, according to an illustrated embodiment.

FIG. 4A is a truth table of 4-bit NVFF counter 300. FIG. 4B schematically illustrates waveforms of various input and output signals of counter 300 during counting operations, according to an illustrated embodiment. As shown in FIG. 4B, at clock pulse no. 0, a reset pulse is applied to the clear terminals CLR of all of NVFFs 311, 312, 313, and 314, such that the outputs $Q_A$, $Q_B$, $Q_C$, and $Q_D$ on output terminals Q of NVFFs 311, 312, 313, and 314 are reset to "0". At this time, a feedback signal at the inverse output terminal Qb of fourth NVFF 314 having a logical data value of "1" is input to input terminal D of first NVFF 311. At clock pulse no. 1, in response to the logical data "1" at input terminal D of first NVFF 311, the output $Q_A$ of first NVFF 311 is updated from "0" to "1", while the outputs $Q_B$, $Q_C$, and $Q_D$ of other NVFFs 312, 313, and 314 remain at "0". As a result, as shown in FIG. 4A, the single output bit MC[0] of counter 300 is updated from "0" to "1". At clock pulse no. 2, in response to the logical data "1" at output terminal Q of first NVFF 311 which is connected to input terminal D of second NVFF 312, the output $Q_B$ of second NVFF 312 is updated from "0" to "1", while the outputs $Q_A$, $Q_C$, and $Q_D$ of other NVFFs 311, 313, and 314 remain unchanged. As a result, the single output bit MC[0] of counter 300 is updated from "1" to "0". At clock pulse no. 3, in response to the logical data "1" at output terminal Q of second NVFF 312 which is connected to input terminal D of third NVFF 313, the output $Q_C$ of third NVFF 313 is updated from "0" to "1", while the outputs $Q_A$, $Q_B$, and $Q_D$ of other NVFFs 311, 312, and 314 remain unchanged. As a result, the single output bit MC[0] of counter 300 is updated from "0" to "1". At clock pulse no.

4, in response to the logical data "1" at output terminal Q of third NVFF 313 which is connected to input terminal D of fourth NVFF 314, the output $Q_D$ of fourth NVFF 314 is updated from "0" to "1", while the outputs $Q_A$, $Q_B$, and $Q_C$ of other NVFFs 311, 312, and 313 remain unchanged. As a result, the single output bit MC[0] of counter 300 is updated from "1" to "0". At this time, the logical value on the inverse output terminal Qb of fourth NVFF 314 becomes "0", which is applied to input terminal D of first NVFF 311. At clock pulse no. 5, in response to the logical data "0" at input terminal D of first NVFF 311, the output $Q_A$ of first NVFF 311 is updated from "1" to "0", while the outputs $Q_B$, $Q_C$, and $Q_D$ of other NVFFs 312, 313, and 314 remain unchanged. As a result, the single output bit MC[0] of counter 300 is updated from "0" to "1". At clock pulse no. 6, in response to the logical data "0" at output terminal Q of first NVFF 314 which is connected to input terminal D of second NVFF 312, the output $Q_B$ of second NVFF 312 is updated from "1" to "0", while the outputs $Q_A$, $Q_C$, and $Q_D$ of other NVFFs 311, 313, and 314 remain unchanged. As a result, the single output bit MC[0] of counter 300 is updated from "1" to "0". At clock pulse no. 7, in response to the logical data "0" at output terminal Q of second NVFF 312 which is connected to input terminal D of third NVFF 313, the output $Q_C$ of third NVFF 313 is updated from "1" to "0", while the outputs $Q_A$, $Q_B$, and $Q_D$ of other NVFFs 311, 312, and 314 remain unchanged. As a result, the single output bit MC[0] of counter 300 is updated from "0" to "1". Accordingly, the initial logical value "1" passes through first through fourth NVFFs 311 through 314, and then the logical value of the inverse output terminal Qb of fourth NVFF 314, i.e., "0", passes through first through fourth NVFFs 311 through 314. Hereinafter, a process of an NVFF updating its output value from "0" to "1" is referred to as an erase cycle, and a process of an NVFF updating its output value from "1" to "0" is referred to as a program cycle.

In this manner, counter 300 can provide 8 updates for its single output bit MC[0] by performing only two updates for each one of four bits $Q_A$, $Q_B$, $Q_C$, and $Q_D$ of counter 300. When counter 300 is implemented as a LSB of a monotonic counter, such monotonic counter can provide a maximum of 8 counts by performing two program/erase cycles on each one of NVFFs 311, 312, 313, and 314 in counter 300.

Figure 5:
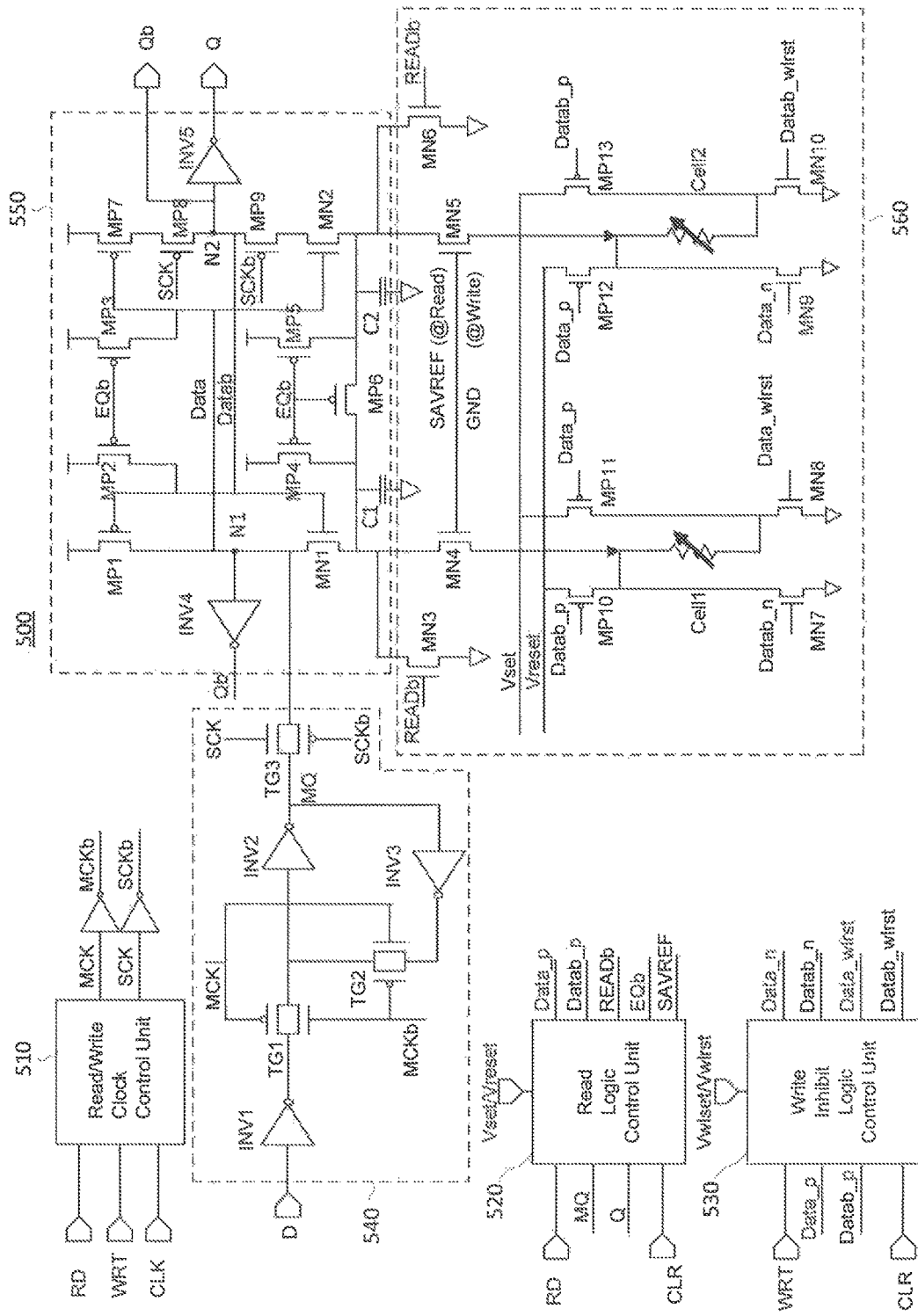
FIG. 5 schematically illustrates a circuit diagram of a NVFF, according to an illustrated embodiment.

As described above, according to the embodiments of the present disclosure, each one of the NVFFs of the NVFF counter includes a pair of memory cells. FIG. 5 schematically illustrates a circuit diagram of a NVFF 500 according to an illustrated embodiment. NVFF 500 includes a read/write clock control unit 510, a read logic control unit 520, a write inhibit logic control unit 530, a storage section 540, a flip-flop section 550, and a non-volatile memory section 560.

Read/write clock control unit 510 generates reference signals MCK, MCKb, SCK, and SCKb, based on external signals respectively applied at a read terminal RD, a write terminal WRT, and a clock terminal CLK of NVFF 500. Read logic control unit 520 generates reference signals Data_p, Datab_p, READb, EQb, and SAVREF, based on external signals respectively applied at the read terminal RD, a clear terminal CLR, and a set/reset terminal of NVFF 500, and internal signal MQ driven from data input at input terminal D of NVFF 500 and data output at output terminal Q of NVFF 500. Write inhibit logic control unit 530 generates reference signals Data_n, Datab_n, Data_wlrst, and Datab_wlrst, based on external signals respectively applied at the write terminal WRT, the clear terminal CLR, and a wordline set/reset terminal of NVFF 500, and signals Data_p and Datab_p generated by read logic control unit 520.

Storage section 540 is connected between input terminal D and a first node N1 of flip-flop section 550. Storage section 540 includes first, second, and third inverters INV1, INV2, and INV3, and first, second, and third transmission gates TG1, TG2, and TG3. Storage section 540 is controlled by signals MCK, MCKb, MQ, SCK, and SCKb to temporarily store data received at input terminal D.

Flip-flop section 550 is coupled between storage section 540 and output terminals Q and Qb. Flip-flop section 550 includes first and second nodes N1 and N2, fourth and fifth inverters INV4 and INV5, first and second N-type metal-oxide semiconductor field-effect transistor (NMOSFETs) MN1 and MN2, first through ninth P-type MOSFETs (PMOSFETs) MP1 through MP9, and first and second capacitors C1 and C2. Flip-flop section 550 is controlled by signals EQb, SCK, and SCKb, such that first and second nodes N1 and N2 have a pair of inverse data values Data and Datab. In addition, in response to the clock signal applied to clock terminal CLK, flip-flop section 550 outputs the pair of inverse data values on first and second nodes N1 and N2 via output terminals Q and Qb, respectively.

Non-volatile memory section 560 includes first and second memory cells Cell1 and Cell2, third through tenth NMOSFETs MN3 through MN10, and tenth through thirteenth PMOSFETS MP10 through MP13. Non-volatile memory section 560 is controlled by signals SAVREF, READb, Data_p, Datab_p, Daba_n, Datab_n, Data_wlrst, and Datab_wlrst. First and second memory cells Cell1 and Cell2 are respectively connected to first and second nodes N1 and N2. When a write signal which is applied to the write terminal WRT of NVFF 500 transitions from a low level to a high level, the logical data values on first and second nodes N1 and N2 are stored into first and second memory cells Cell1 and Cell2, respectively. When a read signal which is applied to the read terminal RD of NVFF 500 transitions from a low level to a high level, the logical data values stored in first and second memory cells Cell1 and Cell2 are read back to first and second nodes N1 and N2, respectively. As described above, memory cells Cell1 and Cell2 can be non-volatile RAM cells such as, for example, ReRAM cells, CBRAM cells, MRAM cells, FeRAM cells, or PCM cells.

As described above, a 4-bit NVFF counter 300 including 4 NVFFs can provide 8 updates for a single output bit by performing 2 program/erase cycles on each one of the NVFFs. Generally, by performing 2 program/erase cycles on each NVFF, an n-bit NVFF counter including n NVFFs can provide a maximum of 2n updates for its single output bit. More generally, by performing P program/erase cycles on each NVFF, an n-bit NVFF counter including n such NVFFs can provide a maximum of P/2×2n=P×n updates for its single output bit. Assuming that each one of the memory cells included in a NVFF can endure an estimated total of E program/erase cycles, i.e., E program/erase cycles can be performed on a memory cell in its life time, then, an n-bit NVFF counter including n NVFFs can provide a maximum of E×n updates for its single output bit by performing E program/erase cycles on each memory cell inside the n NVFFs. For example, by performing 16 thousands (16K) program/erase cycles on each NVFF, a 1024-bit NVFF counter including 1024 NVFFs can provide a maximum of about 16 million (16 M) updates for its single output bit. When the single output bit is used as an LSB of a monotonic counter, the monotonic counter can provide a maximum of about 16 M counts. In other words, in order for an NVFF counter to implement a LSB of a monotonic counter which is configured to count a maximum of M counts, the NVFF counter is required to include M/P NVFFs, where P is an estimated number of program/erase cycles in the life of a NVFF.

Figure 6:
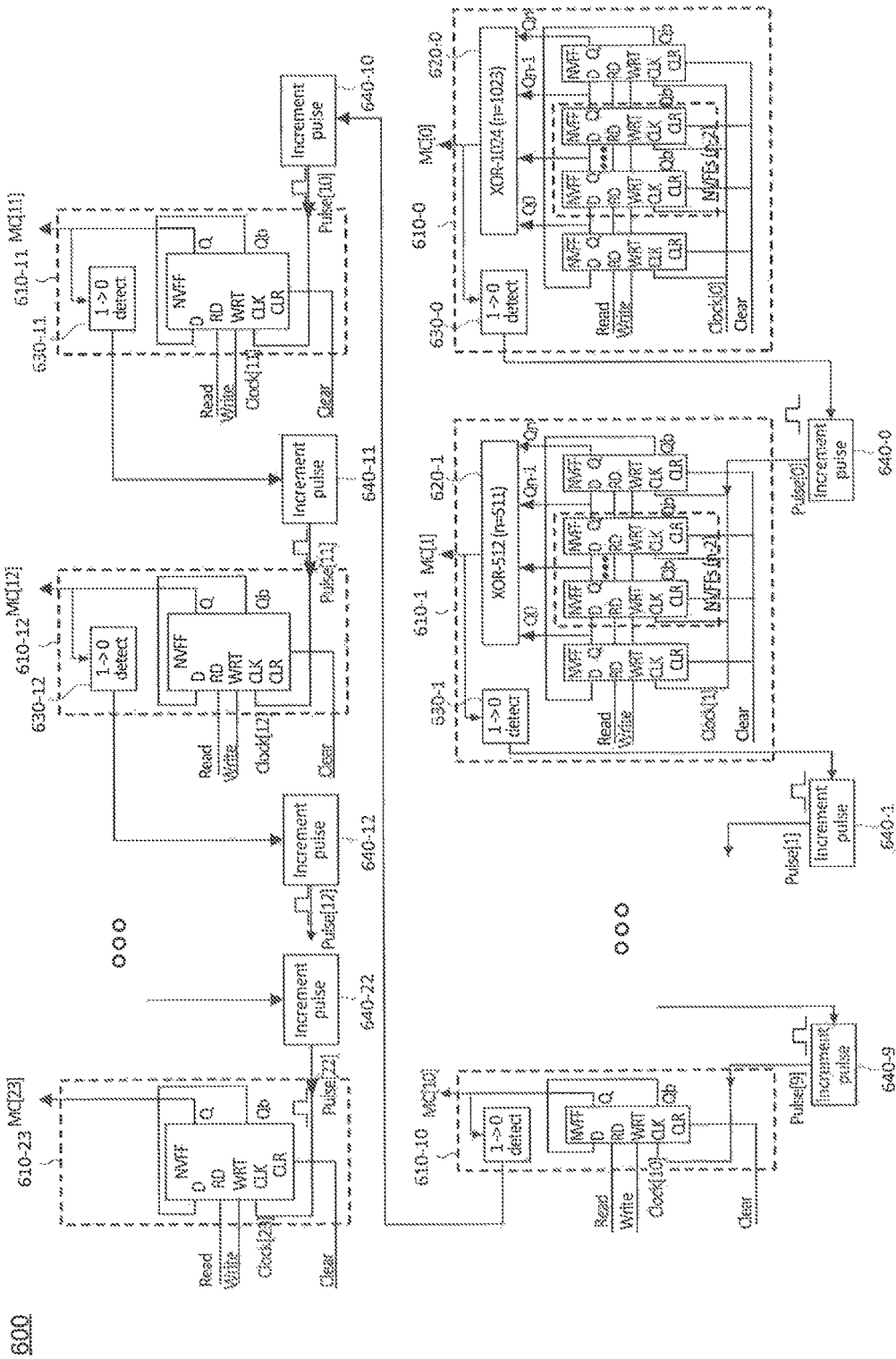
FIG. 6 schematically illustrates a 24-bit NVFF monotonic counter, according to an illustrated embodiment.

FIG. 6 schematically illustrates a 24-bit monotonic counter 600, according to an illustrated embodiment. FIG. 7 is a summary of the configuration of 24-bit monotonic counter 600. According to FIGS. 6 and 7, 24-bit monotonic counter 600 includes 24 stages 610-0, 610-1, . . . , 610-23 respectively outputting 24 counting bits MC[0], MC[1], . . . , and MC[23], that, in combination, constitute a counting value of counter 600.

Each one of stages 610-0, 610-1, . . . , 610-9 is an NVFF counter which includes n NVFFs that respectively output bits Q0, Q1, . . . , Qn−1, where $n=2^{11-i}$ for an i-th NVFF counter. For example, first stage 610-0 includes 1024 NVFFs; second stage 610-1 includes 512 NVFFs; third stage 610-2 includes 256 NVFFs; and so on. In each stage, the inverse output terminal Qb of the last NVFF, which outputs the LSB Qn−1, is connected to the input terminal D of the first NVFF.

In addition, each one of stages 610-0, 610-1, . . . , 610-9 includes an XOR gate 620-0, 620-1, . . . , 620-9, a "1" to "0" detector 630-0, 630-1, . . . , 630-9, and an increment pulse generator 640-0, 640-1, . . . , 640-9. Each one of XOR gates 620-0, 620-1, . . . , 620-9 is connected to the output terminals Q of the NVFFs included in the corresponding stages 610-0, 610-1, . . . , 610-9 to receive the n bits Q0, Q1, . . . , Qn−1 respectively output from the NVFFs, and is configured to generate the corresponding counting bit MC[0], MC[1], . . . , MC[9]. Each one of "1" to "0" detectors 630-0, 630-1, . . . , 630-9 is connected to the output of the corresponding XOR gate 620-0, 620-1, . . . , 620-9 to receive the corresponding counting bit MC[0], MC[1], . . . , MC[9], and is configured to generate a trigger signal when the corresponding counting bit MC[0], MC[1], . . . , MC[9] transitions from "1" to "0". Each one of increment pulse generators 640-0, 640-1, . . . , 640-9 is connected to the corresponding "1" to "0" detector 630-0, 630-1, . . . , 630-9, and is configured to generate a pulse Pulse[0], Pulse[I], . . . , Pulse[9] in response to receiving the trigger signal from the corresponding detector 630-0, 630-1, . . . , 630-9, and transmit the pulse to the clock terminals CLK of the NVFFs of the next and higher-order stage as an input clock of the next and higher-order stage. For example, increment pulse generator 640-0 of first stage 610-0 transmits Pulse [0] to the clock terminals CLK of the NVFFs of second stage 610-1 as an input clock Clock[1]; increment pulse generator 640-1 of second stage 610-1 transmits Pulse [1] to the clock terminals CLK of the NVFFs of third stage 610-2 as an input clock Clock[2]; and so on. The NVFFs of first stage 610-0 receives a pulse as an input clock Clock[0], from a controller external to counter 600. In each stage, in response to the rising edge of the input clock, the corresponding NVFF counter performs a counting operation.

Each one of stages 610-10, 610-11, . . . , 610-23 includes one NVFF that outputs the corresponding counting bit MC[10], MC[11], . . . , MC[23]. In each NVFF, the inverse output terminal Qb is connected to the input terminal D. In addition, each one of stages 610-10, 610-11, . . . , 610-22 includes a "1" to "0" detector 630-10, 630-11, . . . , 630-22, and an increment pulse generator 640-10, 640-11, . . . , 640-22. Each one of "1" to "0" detectors 630-10, 630-11, . . . , 630-22 is connected to the output terminal Q of the NVFF included in the corresponding stage 610-10, 610-11, . . . , 610-22 to receive the corresponding counting bit MC[10], MC[11], . . . , MC[23] from the NVFF, and is configured to generate a trigger signal when the corresponding counting bit MC[10], MC[11], . . . , MC[23] transitions from "1" to "0". Each one of increment pulse generators 640-10, 640-11, . . . , 640-22 is connected to the corresponding "1" to "0" detector 630-10, 630-11, . . . , 630-22, and is configured to generate a pulse Pulse[10], Pulse[11], . . . , Pulse[22] in response to receiving the trigger signal from the corresponding "1" to "0" detector 630-10, 630-11, . . . , 630-22, and transmit the pulse to the clock terminal CLK of the NVFF of the next stage as an input clock of the next and higher-order stage.

Assuming that a maximum of 16 thousands (16K) program/erase cycles can be performed on a NVFF in its life time, then, as illustrated by the summary table of FIG. 7, the 1024-bit NVFF counter 610-0 can provide a maximum of about 16 million (16 M) updates for the LSB MC[0] of 24-bit monotonic counter 600 by performing 16K program/erase cycles on each NVFF; the 512-bit NVFF counter 610-1 can provide a maximum of about 8 M counts for MC[1] by performing about 16K program/erase cycles on each NVFF; and so on. Since the number of counts provided by a monotonic counter is generally limited by the number of updates provided by its LSB, by using the configuration illustrated in FIG. 6, 24-bit monotonic counter 600 can provide a maximum of 16 M counts.

Generally, an m-bit monotonic counter including m counting bits MC[(m−1):0] can be configured to provide a maximum of $2^m$ counts, by performing $2^{m-i}$ updates for counting bit M[i], where i=0, 1, . . . , m−1, and M[0] is the LSB. When the counting bits MC[m−1:0] are implemented by NVFFs, if, for a counting bit M[i], the number of updates required, $2^{m-i}$, is greater than P, where P is an estimated number of program/erase cycles in life of a NVFF, the counting bit M[i] is implemented by a NVFF counter including around n NVFFs, where $n=2^{m-i}/P$. If the number of updates required, $2^{m-i}$, is less than or equal to P, the counting bit M[i] is implemented by a single NVFF.

In 24-bit monotonic counter 600, the lower-order counting bits, such as MC[0], MC[1], . . . , and MC[9], are implemented by lower-order stages each including more than one NVFF, while the higher-order counting bits, such as MC[10], MC[11], . . . , MC[23], are implemented by higher-order stages each including only one NVFF. In order for counter 600 to provide a maximum of 16 M counts, each one of the NVFFs implementing the lower-order counting bits requires 16K program/erase cycles, while each one of the NVFFs implementing the higher-order counting bits requires fewer than 16K program/erase cycles. For example, each one of the NVFFs implementing MC[0] requires 16K program/erase cycles, while the NVFF implementing MC[23] requires only 2 program/erase cycles. Accordingly, the number of program/erase cycles performed on the NVFFs is highly unbalanced.

In order to perform substantially the same number of program/erase cycles on the NVFFs in a monotonic counter, in a balanced monotonic counter according to an embodiment of the disclosure, the lower-order stages and the higher-order stages are configured to alternately provide counting bits for the monotonic counter.

Figure 8:
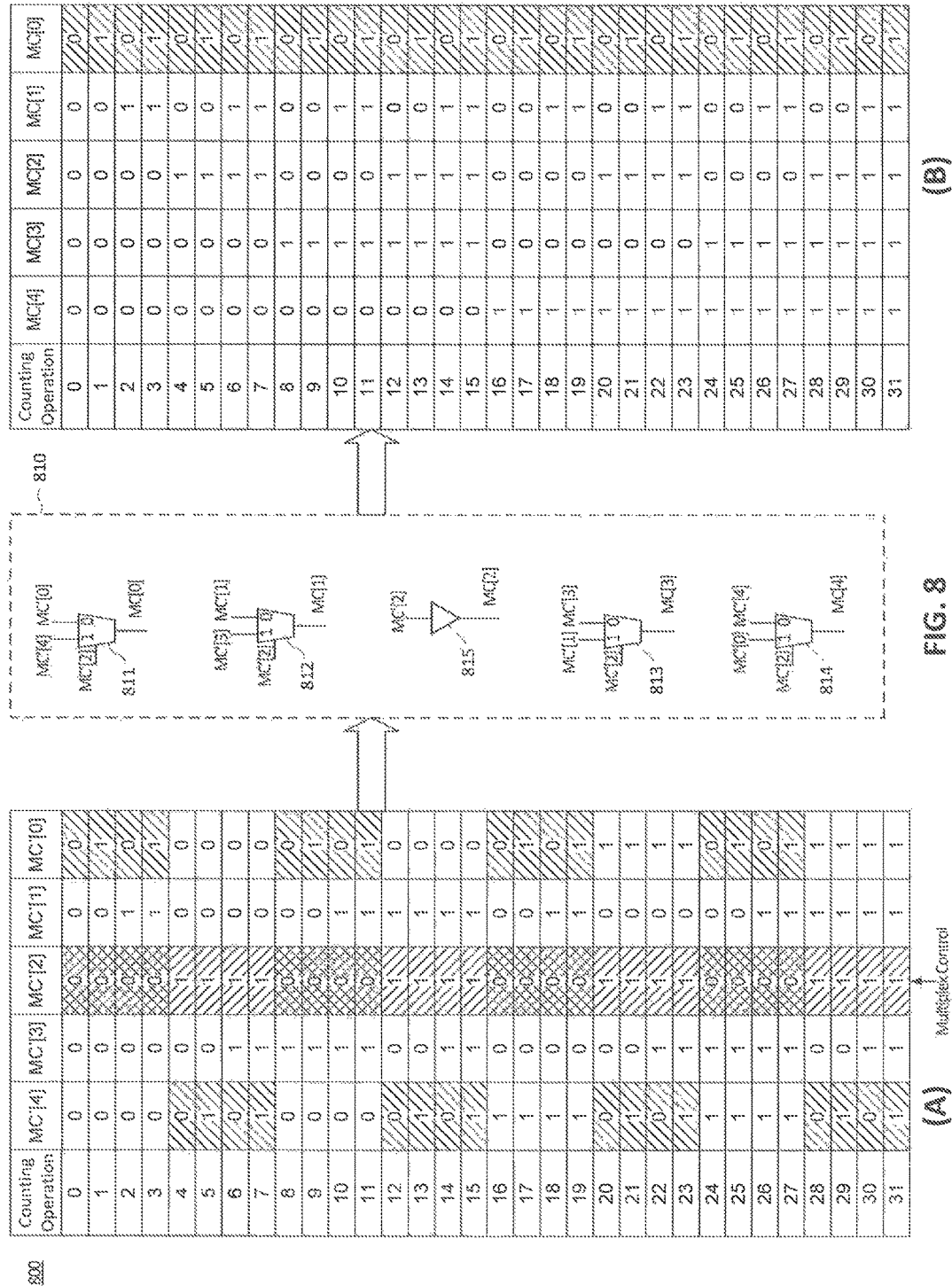
FIG. 8 illustrates a counting scheme of a 5-bit balanced monotonic counter, according to an illustrated embodiment.

FIG. 8 illustrates a counting scheme of an odd-numbered balanced monotonic counter 800, according to an illustrated embodiment. For simplicity of explanation, counter 800 includes only five counting bits. However, counter 800 can include fewer or more than five counting bits.

Counter 800 includes stages (not illustrated) and an output control circuit 810. First through fifth stages are configured to generate intermediate bits MC'[0], MC'[1], . . . , MC'[4], respectively, as indicated in Table A of FIG. 8. Then, intermediate bits MC'[0], MC'[1], . . . , MC'[4] are input to output control circuit 810, which generates counting bits MC[0], MC[1], . . . , MC[4] as indicated in Table B of FIG. 8.

In output control circuit 810, intermediate bit MC'[2] is used as a multiplexer control to select either one of intermediate bits MC'[0] and MC'[4] to be output as counting bit MC[0] or MC[4], and to select either one of intermediate bits MC'[1] and MC'[3] to be output as counting bit MC[1] or MC[3]. Specifically, output control circuit 810 includes first through fourth multiplexers 811, 812, 813, and 814, and a driver 815. Each one of first through fourth multiplexers 811, 812, 813, and 814 includes a "0" input terminal, a "1" input terminal, a select terminal, and an output terminal, and is configured to output the bit received at either one of the "0" input terminal and the "1" input terminal based on the bit received at the select terminal. When the bit at the select terminal is "0", the multiplexer outputs the bit received at the "0" input terminal; and when the bit at the select terminal is "1", the multiplexer outputs the bit received at the "1" input terminal.

In the embodiment illustrated in FIG. 8, intermediate bit MC'[2] is input to the select terminals of all of first through fourth multiplexers 811, 812, 813, and 814 to be used as a multiplexer control for these multiplexers. Intermediate bits MC'[4] and MC'[0] are respectively input to the "1" input terminal and the "0" input terminal of first multiplexer 811 which subsequently outputs counting bit MC[O] based on intermediate bit MC'[2]; intermediate bits MC'[3] and MC'[1] are respectively input to the "1" input terminal and the "0" input terminal of second multiplexer 812 which subsequently outputs counting bit MC[1] based on intermediate bit MC'[2]; intermediate bits MC'[1] and MC'[3] are respectively input to the "1" input terminal and the "0" input terminal of third multiplexer 813 which subsequently outputs counting bit MC[3] based on intermediate bit MC'[2]; and intermediate bits MC[0] and MC[4] are respectively input to the "1" input terminal and the "0" input terminal of fourth multiplexer 814 which subsequently outputs counting bit MC[4] based on intermediate bit MC'[2]. Intermediate bit MC'[2] is input to driver 815 to be output as counting bit MC[2].

Taking MC[0] for example, in counting operation nos. 0 through 3, MC'[2] is "0", and thus first multiplexer 811 outputs MC'[0] as MC[0]; in counting operation nos. 4 through 7, MC'[2] is "1", and thus first multiplexer 811 outputs MC'[4] as MC[0]; in counting operation nos. 8 through 11, MC'[2] is "0", and thus first multiplexer 811 outputs MC'[0] as MC[0]; and so on.

In this manner, counter 800 provides a maximum of 32, 16, 8, 4, 2 updates for counting bits MC[0], MC[1], MC[2], MC[3], MC[4], respectively, by performing 16, 8, 8, 8, 16 updates for intermediate bits MC'[0], MC'[1], MC'[2], MC'[3], MC'[4], respectively. Thus, the number of program/erased cycles performed on the NVFFs included in these stages are balanced.

More generally, for an m-bit balanced monotonic counter where m is a positive odd number greater than 1, intermediate bit MC'[(m−1)/2] is used as a multiplexer control to select either one of intermediate bits MC'[i] and MC'[m−1−i] to be output as counting bit MC[i] or MC[m−1−i], where i is an integer and 0≤i<(m−1)/2. In addition, intermediate bit MC'[(m−1)/2] is output as counting bit MC[(m−1)/2].

In order for the first through fifth stages to generate the intermediate bits as indicated in Table A of FIG. 8, an input clock of each one of second through fifth stages is selectively coupled to the output of its immediately previous stage or the output of an opposite stage of its immediately previous stage based on intermediate bit MC'[2]. For example, the input clock of the second stage that generates MC'[1] is selectively coupled to MC'[0] or MC'[4] based on MC'[2]; the input clock of the third stage that generates MC'[2] is selectively coupled to the MC'[1] or MC'[3] based on MC'[2]; and so on. The selective coupling can be implemented by a clock control circuit including a plurality of multiplexers, which is similar to output control circuit 810. An example of the clock control circuit will be provided in the embodiment illustrated in FIG. 9.

More generally, for the m-bit balanced monotonic counter where m is a positive odd number greater than 1, intermediate bit MC'[(m−1)/2] is used as a multiplexer control to selectively provide either one of MC'[j] and MC'[m−1−j] as an input clock of a stage that outputs an intermediate bit MC'[j+1], where j is an integer and 0≤j<(m−2).

Figure 9:
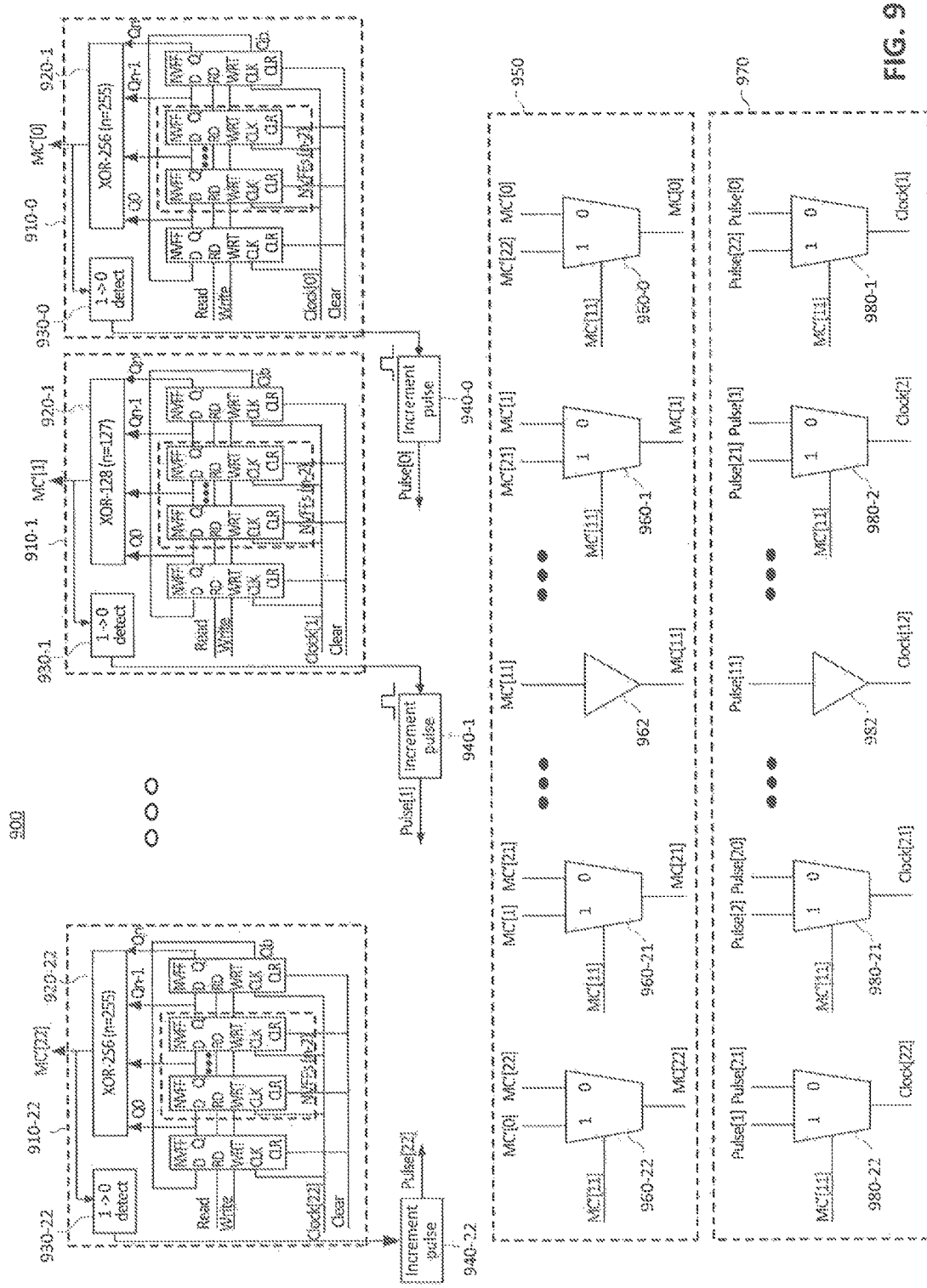
FIG. 9 schematically illustrates a 23-bit balanced monotonic counter, according to an illustrated embodiment.

FIG. 9 schematically illustrates a 23-bit balanced monotonic counter 900, according to an illustrated embodiment. FIG. 10 is a summary of the configuration of 23-bit monotonic counter 900.

According to FIGS. 9 and 10, counter 900 includes 23 stages 910-0, 910-1, . . . , 910-22 respectively outputting intermediate bits MC'[0], MC'[1], . . . , and MC'[22]. Counter 900 also includes an output control circuit 950 which receives the intermediate bits MC'[0], MC'[1], . . . , and MC'[22] and generates counting bits MC[0], MC[1], . . . , MC[22], that, in combination, constitute a counting value of counter 900. Counter 900 further includes a clock control circuit 970 for controlling the clock signals applied to each of stages 910_1, . . . , 910-22.

Each one of stages 910-0, 910-1, . . . , 910-7 and 910-15, 910-16, . . . , 910-22 is an NVFF counter including n NVFFs that respectively output bits Q0, Q1, . . . , Qn−1, where n is an integer greater than 1. For example, each one of stages 910-0 and 910-22 includes 256 NVFFs; each one of stages 910-1 and 910-21 includes 128 NVFFs; each one of stages 910-2 and 910-20 includes 256 NVFFs; and so on. In each stage, the NVFFs are connected in series, and the inverse output terminal Qb of the last NVFF, which outputs the LSB Qn−1, is connected to the input terminal D of the first NVFF.

Each one of stages 910-8, 910-9, . . . , 910-14 includes one NVFF that outputs the corresponding intermediate bit MC'[8], MC'[9], . . . , MC'[14]. In each NVFF, the inverse output terminal Qb is connected to the input terminal D.

In addition, each one of stages 910-0, 910-1, . . . , 910-22 includes an XOR gate 920-0, 920-1, . . . , 920-22, a "1" to "0" detector 930-0, 930-1, . . . , 930-22, and an increment pulse generator 940-0, 940-1, . . . , 940-22. Each one of XOR gates 920-0, 920-1, . . . , 920-22, is connected to receive the bits Q0, Q1, . . . , Qn−1 respectively output from the NVFFs, and is configured to generate the corresponding intermediate bit MC'[0], MC'[1], . . . , MC'[22]. Each one of "1" to "0" detectors 930-0, 930-1, . . . , 930-22 is connected to the output of the corresponding XOR gate 920-0, 920-1, . . . , 920-22 to receive the corresponding intermediate bit MC'[0], MC'[1], . . . , MC'[22], and is configured to generate a trigger signal when the corresponding intermediate bit transitions from "1" to "0". Each one of increment pulse generators 940-0, 940-1, . . . , 940-22 is connected to the corresponding "1" to "0" detector 930-0, 930-1, . . . , 930-22, and is configured to generate a pulse Pulse[0], Pulse[1], . . . , Pulse[22] in response to receiving the trigger signal from the corresponding "1" to "0" detector 930-0, 930-1, ..., 930-22, and transmit the pulse to clock control circuit 970.

Output control circuit 950 includes multiplexers 960-0, 960-1, ..., 960-10, and 960-12, 960-13, ..., 960-22 that respectively output counting bits MC[0], MC[1], ..., MC[10] and MC[12], MC[13], ..., MC[22], and a driver 962 that outputs counting bit MC[11]. Intermediate bit MC'[11] is input to the select terminals of all of multiplexers 960-0, 960-1, ..., 960-10, and 960-12, 960-13, ..., 960-22 to be used as a multiplexer control for these multiplexers. Intermediate bits MC'[22] and MC'[0] are respectively input to the "1" input terminal and the "0" input terminal of multiplexer 960-0 which subsequently outputs counting bit MC[0] based on intermediate bit MC'[11]; intermediate bits MC'[21] and MC'[1] are respectively input to the "1" input terminal and the "0" input terminal of multiplexer 960-1 which subsequently outputs counting bit MC[1] based on intermediate bit MC'[11]; and so on. In addition, intermediate bit MC'[11] is input to driver 962 to be output as counting bit MC[11].

Clock control circuit 970 includes multiplexers 980-1, 980-2, ..., 980-11, and 980-13, 980-14, ..., 980-22 that respectively output clock signals Clock[1], Clock[2], ..., Clock[11], and Clock[13], Clock[14], ..., Clock[22], and a driver 982 that outputs clock signal Clock [12]. Intermediate bit MC'[11] is input to the select terminals of all of multiplexers 980-1, 980-2, ..., 980-11, and 980-13, 980-14, ..., 980-22 to be used as a multiplexer control for these multiplexers. Pulse[22] and Pulse[0] are respectively input to the "1" input terminal and the "0" input terminal of multiplexer 980-1 which subsequently outputs Clock [1] based on intermediate bit MC'[11]; Pulse[21] and Pulse[l] are respectively input to the "1" input terminal and the "0" input terminal of multiplexer 980-2 which subsequently outputs Clock [2] based on intermediate bit MC'[11]; and so on. In addition, Pulse [11] is input to driver 982 to be output as Clock[12].

In this manner, as illustrated by the summary table in FIG. 10, counter 900 provides a maximum of about 8 M counts, by performing 16K program/erase cycles on the NVFFs of stages 910-0, 910-1, ..., 910-8 and 910-14, 910-15, ..., 910-22, 8K program/erase cycles on the NVFFs of stages 910-9, 910-10, 910-12, and 910-13, and 4K program/erase cycles on the NVFFs of stage 910-11. Thus, the numbers of program/erase cycles performed on the NVFFs included in counter 900 are substantially balanced.

Figure 11:
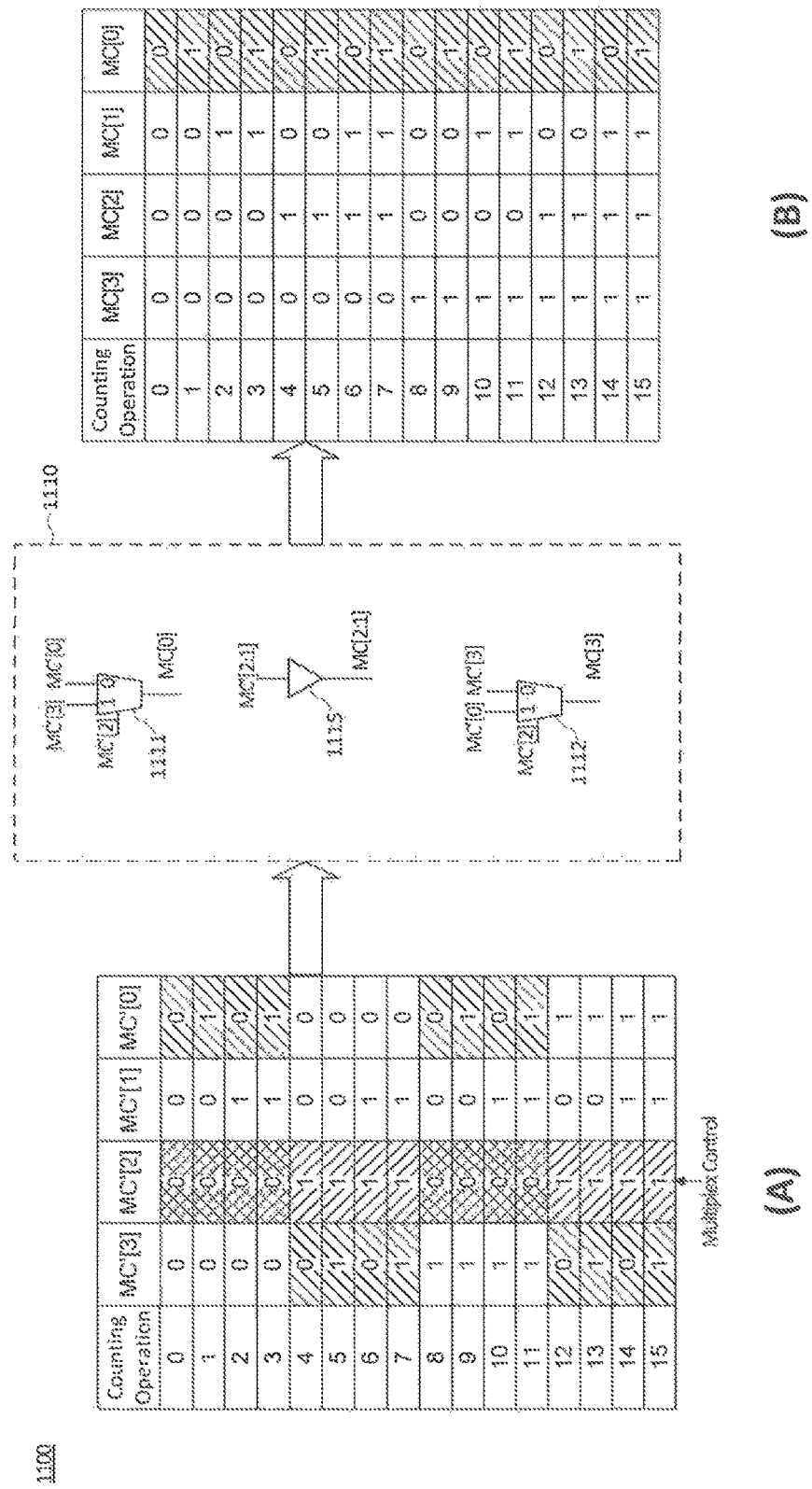
FIG. 11 illustrates a counting scheme of a 4-bit balanced monotonic counter, according to an illustrated embodiment.

FIG. 11 illustrates a counting scheme of an even-numbered balanced monotonic counter 1100, according to an illustrated embodiment. For simplicity of explanation, counter 1100 includes only four counting bits. However, counter 1100 can include fewer or more than four counting bits.

Counter 1100 includes first through fourth stages (not illustrated) and an output control circuit 1110. First through fourth stages are configured to generate intermediate bits MC'[0], MC'[1], ..., MC'[3], respectively, as indicated in Table A of FIG. 11. Then, intermediate bits MC'[0], MC'[1], ..., MC'[3] are input to output control circuit 1110, which generates counting bits MC[0], MC[1], ..., MC[3] as indicated in Table B of FIG. 11.

In output control circuit 1110, intermediate bit MC'[2] is used as a multiplexer control to select either one of intermediate bits MC'[0] and MC'[3] to be output as counting bit MC[0] or MC[3]. Specifically, output control circuit 1110 includes a first multiplexer 1111, a second multiplexer 1112, and a driver 1115. Intermediate bit MC'[2] is input to the select terminals of first and second multiplexers 1111 and 1112 to be used as a multiplexer control. Intermediate bits MC'[3] and MC'[0] are respectively input to the "1" input terminal and the "0" input terminal of first multiplexer 1111 which subsequently outputs counting bit MC[0] based on intermediate bit MC'[2]; and intermediate bits MC'[3] and MC'[0] are respectively input to the "1" input terminal and the "0" input terminal of second multiplexer 1112 which subsequently outputs counting bit MC[3] based on intermediate bit MC'[2]. Intermediate bits MC'[2] and MC'[1] are input to driver 1115 to be output as counting bits MC[2] and MC[1], respectively.

Taking MC[0] for example. In counting operation nos. 0 through 3, MC'[2] is "0", and thus first multiplexer 1111 outputs MC'[0] as MC[0]; in counting operation nos. 4 through 7, MC'[2] is "1", and thus first multiplexer 1111 outputs MC'[3] as MC[0]; in counting operation nos. 8 through 11, MC'[2] is "0", and thus first multiplexer 1111 outputs MC'[0] as MC[0]; and in counting operation nos. 12 through 15, MC'[2] is "1", and thus first multiplexer 1111 outputs MC'[3] as MC[0].

In this manner, counter 1100 provides a maximum of 16, 8, 4, 2 updates for counting bits MC[0], MC[1], MC[2], MC[3], respectively, by performing 8, 8, 4, 8 updates for intermediate bits MC'[0], MC'[1], MC'[2], MC'[3], respectively. Thus, the number of program/erased cycles performed on the NVFFs are balanced.

More generally, for an m-bit balanced monotonic counter where m is a positive even number greater than 1, intermediate bit MC'[m/2] is used as a multiplexer control to select either one of intermediate bits MC'[i] and MC'[m−1−i] to be output as counting bit MC[i] or MC[m−1−i], where i is an integer and 0≤i<m/2. In addition, intermediate bits MC'[m/2] and MC'[m/2−1] are output as counting bits MC[m/2] and MC[m/2−1].

In order for the first through fourth stages to generate the intermediate bits as indicated in Table A of FIG. 11, an input clock of each one of second, third, and fourth stages is selectively coupled to the output of its immediately previous stage or the output of an opposite stage of its immediately previous stage based on intermediate bit MC'[2]. For example, the input clock of the second stage that generates MC'[1] is selectively coupled to MC'[0] or MC'[3] based on MC'[2]. The selective coupling can be implemented by a clock control circuit including a plurality of multiplexers, which is similar to output control circuit 1110. An example of the clock control circuit will be provided in the embodiment illustrated in FIG. 12.

More generally, for the m-bit balanced monotonic counter where m is a positive even number greater than 1, intermediate bit MC'[m/2] is used as a multiplexer control to selectively provide either one of MC'[j] and MC'[m−1−j] as an input clock of a stage that outputs an intermediate bit MC'[j+1], where j is an integer and 0≤j<(m−1−j).

Figure 12:
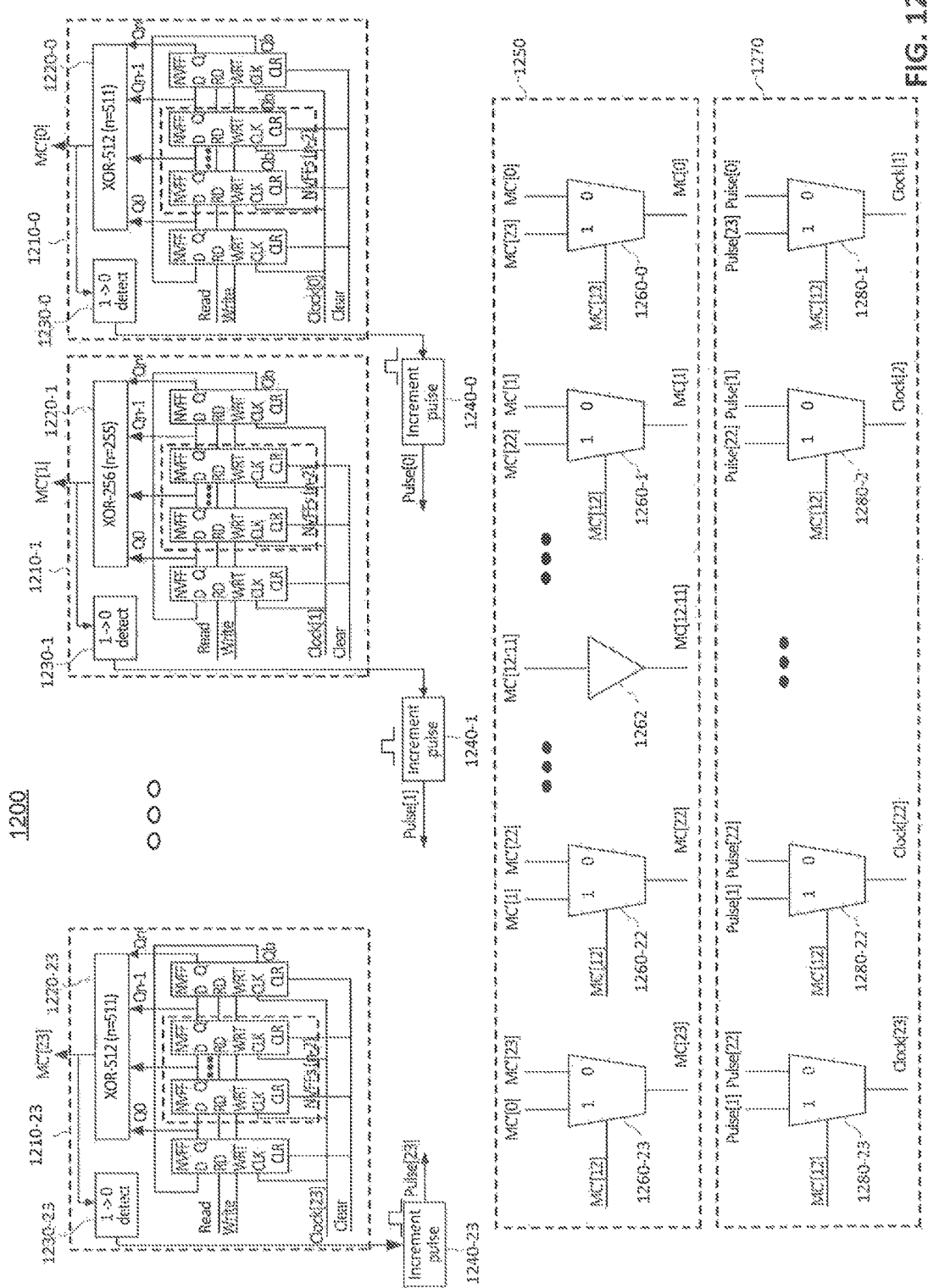
FIG. 12 schematically illustrates a 24-bit balanced monotonic counter, according to an illustrated embodiment.

FIG. 12 schematically illustrates a 24-bit balanced monotonic counter 1200, according to an illustrated embodiment. FIG. 13 is a summary of the configuration of 24-bit monotonic counter 1200.

According to FIGS. 12 and 13, counter 1200 includes 24 stages 1210-0, 1210-1, ..., 1210-23 respectively outputting intermediate bits MC'[0], MC'[1], ..., and MC'[23]. Counter 1200 also includes an output control circuit 1250 which receives the intermediate bits MC'[0], MC'[1], ..., and MC'[23] and generates counting bits MC[0], MC[1], ..., MC[23], that, in combination, constitute a counting value of counter 1200. Counter 1200 further includes a clock control circuit 1270 for controlling the clock signals applied to each of stages 1210_1, ..., 1210-23.

Each one of stages 1210-0, 1210-1, . . . , 1210-8 and 1210-15, 1210-16, . . . , 1210-23 is an n-bit NVFF counter including n NVFFs that respectively output bits Q0, Q1, . . . , Qn−1, where n is an integer greater than 1. For example, each one of stages 1210-0 and 1210-23 includes 512 NVFFs; each one of stages 1210-1 and 1210-22 includes 256 NVFFs; each one of stages 1210-2 and 1210-21 includes 128 NVFFs; and so on. In each NVFF counter, the NVFFs are connected in series, and the inverse output terminal Qb of the last NVFF, which outputs the LSB Qn−1, is connected to the input terminal D of the first NVFF.

Each one of stages 1210-9, 1210-10, . . . , 1210-14 includes one NVFF that outputs the corresponding intermediate bit MC'[9], MC'[10], . . . , MC'[14]. In each NVFF, the inverse output terminal Qb is connected to the input terminal D.

In addition, each one of stages 1210-0, 1210-1, . . . , 1210-23, includes an XOR gate 1220-0, 1220-1, . . . , 1220-23, a "1" to "0" detector 1230-0, 1230-1, . . . , 1230-23, and an increment pulse generator 1240-0, 1240-1, . . . , 1240-23. Each one of XOR gates 1220-0, 1220-1, . . . , 1220-23, is connected to receive the bits Q0, Q1 . . . , Qn−1 respectively output from the NVFFs included in the corresponding stages 1210-0, 1210-1, . . . , 1210-23, and is configured to generate the corresponding intermediate bit MC'[0], MC'[1], . . . , MC'[23]. Each one of "1" to "0" detectors 1230-0, 1230-1, . . . , 1230-23 is connected to receive the corresponding intermediate bit MC'[0], MC'[1], . . . , MC'[23], and is configured to generate a trigger signal when the corresponding intermediate bit transitions from "1" to "0". Each one of increment pulse generators 1240-0, 1240-1, . . . , 1240-23 is connected to the corresponding "1" to "0" detector 1230-0, 1230-1, . . . , 1230-23, and is configured to generate a pulse Pulse[0], Pulse[1], . . . , Pulse[23] in response to receiving the trigger signal from the corresponding "1" to "0", and transmit the pulse to clock control circuit 1270.

Output control circuit 1250 includes multiplexers 1260-0, 1260-1, . . . , 1260-10, and 1260-13, 1260-14, . . . , 1260-23 that respectively output counting bits MC[0], MC[1], . . . , MC[10] and MC[13], MC[14], . . . , MC[23], and a driver 1262 that outputs counting bits MC[12] and MC[11]. Intermediate bit MC'[12] is input to the select terminals of all of multiplexers 1260-0, 1260-1, . . . 1260-10, and 1260-13, 1260-14, . . . , 1260-23, to be used as a multiplexer control for these multiplexers. Intermediate bits MC'[23] and MC'[0] are respectively input to the "1" input terminal and the "0" input terminal of multiplexer 1260-0 which subsequently outputs counting bit MC[0] based on intermediate bit MC'[12]; intermediate bits MC'[22] and MC'[1] are respectively input to the "1" input terminal and the "0" input terminal of multiplexer 1260-1 which subsequently outputs counting bit MC[1] based on intermediate bit MC'[12]; and so on. In addition, intermediate bits MC'[12] and MC'[11] are input to driver 1262 to be output as counting bits MC[12] and MC[11].

Clock control circuit 1270 includes multiplexers 1280-1, 1280-2, . . . , 1280-23 that respectively output clock signals Clock[1], Clock[2], . . . , Clock[23]. Intermediate bit MC'[12] is input to the select terminals of all of multiplexers 1280-1, 1280-2, . . . , 1280-23 to be used as a multiplexer control for these multiplexers. Pulse[23] and Pulse[0] are respectively input to the "1" input terminal and the "0" input terminal of multiplexer 1280-1 which subsequently outputs Clock [1] based on intermediate bit MC'[12]; Pulse[22] and Pulse[1] are respectively input to the "1" input terminal and the "0" input terminal of multiplexer 1280-2 which subsequently outputs Clock [2] based on intermediate bit MC' [12]; and so on.

In this manner, as illustrated by the summary table in FIG. 13, counter 1200 provides a maximum of about 16 M counts, by performing 16K program/erase cycles on the NVFFs of stages 1210-0, 1210-1, . . . , 1210-9 and 1210-14, 1210-15, . . . , 1210-23, 8K program/erase cycles on the NVFFs of stages 1210-10, 1210-11, and 1210-13, and 4K program/erase cycles on the NVFF of stage 1210-12. Thus, the numbers of program/erase cycles performed on the NVFFs included in counter 1200 are substantially balanced.

Figure 14:
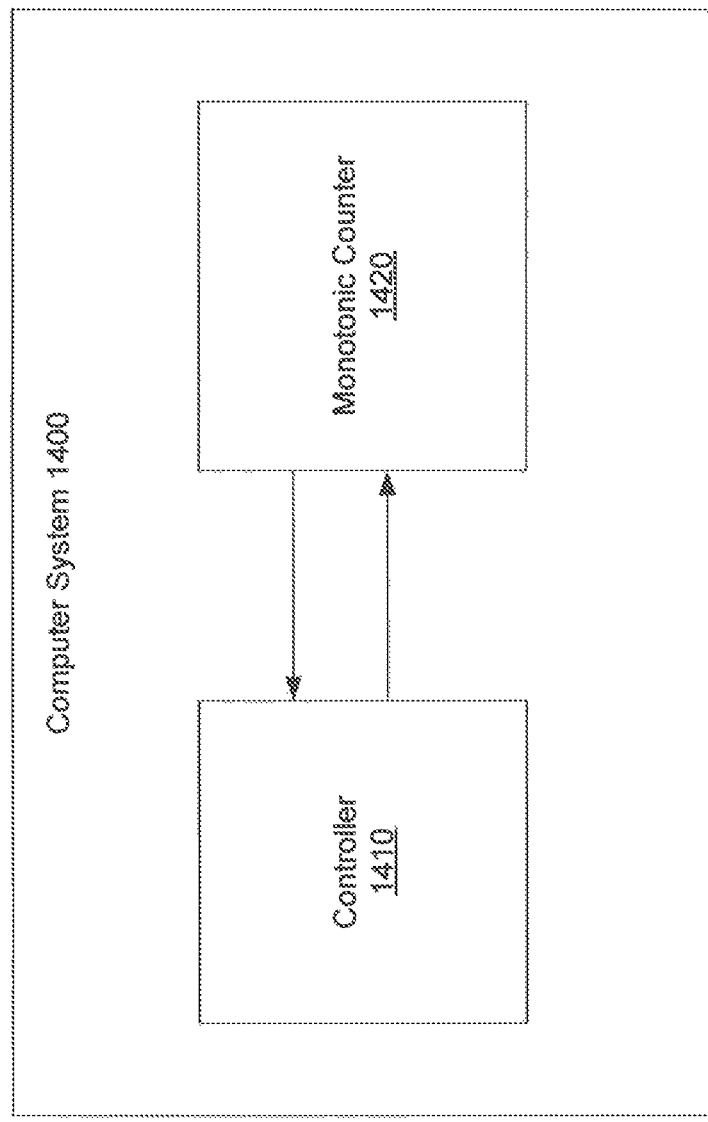
FIG. 14 schematically illustrates a computer system including a monotonic counter, according to an illustrated embodiment.

FIG. 14 schematically illustrates a computer system 1400, according to an embodiment of the present disclosure. Computer system 1400 includes a controller 1410 and a monotonic counter 1420. Monotonic counter 1420 can be implemented as any one of counters described above, such as counters 100, 600, 800, 900, 1100, and 1200. Controller 1410 supplies various control signals, such as a clock signal, a clear signal, a read signal, and a write signal, and power source voltages $V_{CC}$, $V_{GND}$ to monotonic counter 1420. Monotonic counter 1420 transmits a counting value to controller 1410 in response to the read signal.

Figure 15:
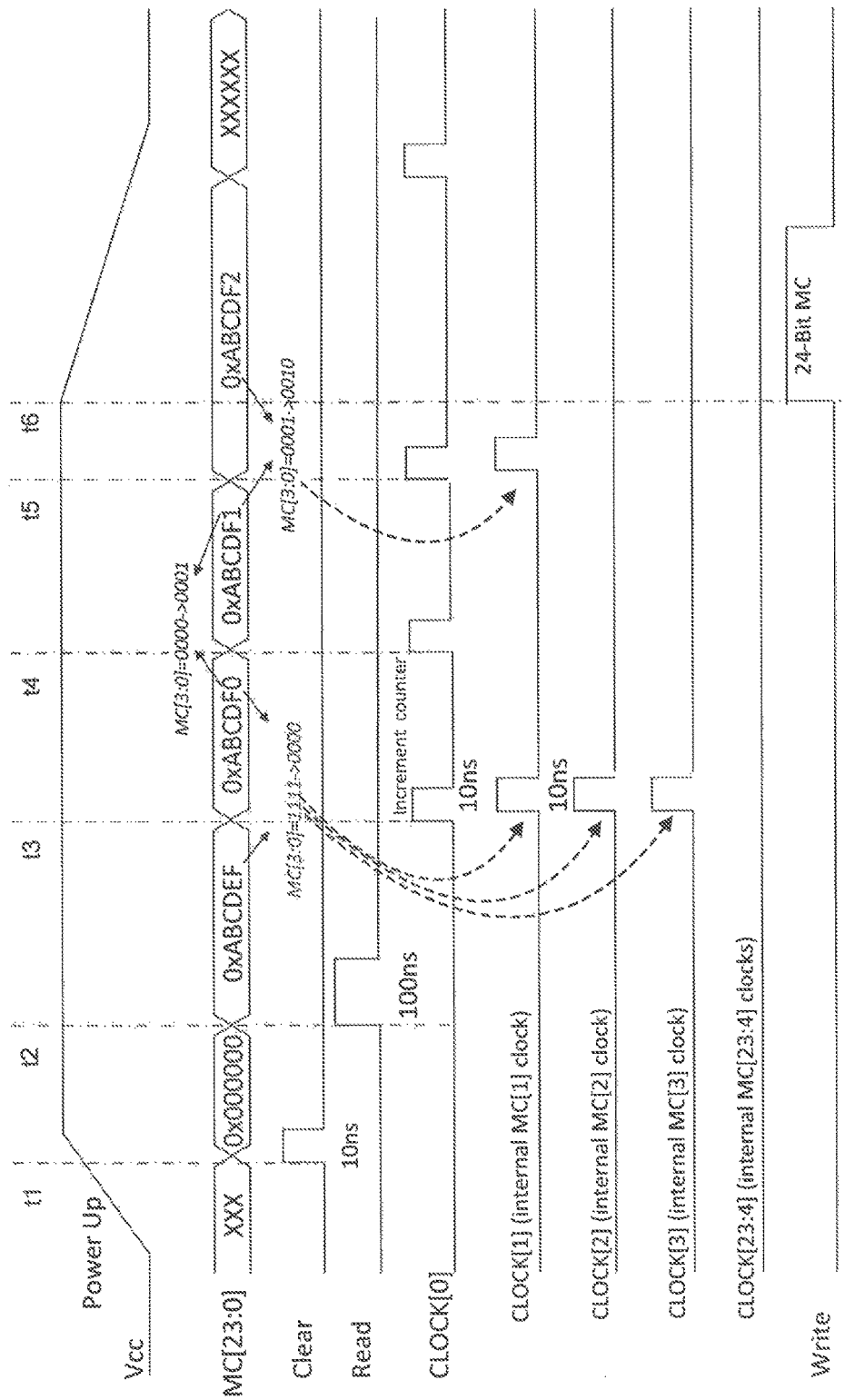
FIG. 15 schematically illustrates waveforms of various input and output signals of a monotonic counter, according to an exemplary embodiment.

FIG. 15 schematically illustrates waveforms of various input and output signals of monotonic counter 1420 in computer system 1400, according to an exemplary embodiment. In the embodiment illustrated in FIG. 15, monotonic counter 1420 includes 24 counting bits MC[23:0] respectively implemented by 24 stages. At least one of the stages includes more than one NVFF. Each NVFF includes a flip-flop section and a non-volatile section including two memory cells. Before computer system 1400 is powered up, the memory cells included in the non-volatile sections of the NVFFs have logical values stored therein, that, in combination, represent a counting value of 0xABCDEF in hexadecimal (hex) for counter 1420.

As illustrated in FIG. 15, when computer system 1400 is powered up, power source voltage $V_{CC}$ gradually increases from a lower level to a higher level. While power source voltage $V_{CC}$ increases, at time t1, controller 1410 supplies a clear pulse having a pulse width of 10 nanoseconds (ns) to the clear terminals CLR of all of the NVFFs included in counter 1420. In response to the clear pulse, all of counting bits MC[23:0] become "0", and thus the counter 1420 has a counting value of 0x000000 (hex).

At time t2, controller 1410 supplies a read pulse having a pulse width of 100 ns to the read terminals RD of all of the NVFFs included in counter 1420. In response to the read pulse, the logical values stored in the memory cells included in the non-volatile sections of the NVFFs are respectively read back into the flip-flop sections of the same NVFFs. Therefore, counting bits MC[23:0] implemented by the NVFFs provide a counting value 0xABCDEF (hex).

At time t3, controller 1410 supplies a first clock pulse CLOCK[0] to the clock terminal CLK of the stage implementing the LSB MC[0]. In response to first clock pulse CLOCK[0], the counting value changes from 0xABCDEF (hex) to 0xABCDF0 (hex). That is, the counting bits MC[3:0] change from 1111 in binary to 0000 in binary. Due to the "1" to "0" detector included in each stage, clock pulses CLOCK[1], CLOCK[2], and CLOCK[3] are generated.

At time t4, controller 1410 supplies a second clock pulse CLOCK[0] to the clock terminal CLK of the stage implementing the LSB MC[0]. In response to second clock pulse CLOCK[0], the counting value changes from 0xABCDF0 (hex) to 0xABCDF1 (hex). That is, the counting bits MC[3:

0] change from 0000 in binary to 0001 in binary. Since none of the counting bits change from "1" to "0", CLOCK [1] is not generated.

At time t5, controller 1410 supplies a third clock pulse CLOCK[0] to the clock terminal CLK of the stage implementing the LSB MC[0]. In response to third clock pulse CLOCK[0], the counting value changes from 0xABCDF1 (hex) to 0xABCDF2 (hex). That is, the counting bits MC[3:0] change from 0001 in binary to 0010 in binary. Since MC[0] changes from "1" to "0", clock pulse CLOCK[1] is generated.

At time t6, before another clock pulse is supplied, a power down event is triggered by a user or due to power failure. In such case, the power source voltage $V_{CC}$ gradually decreases from the higher level to the lower level. In such case, controller 1410 supplies a write pulse to the write terminals WRT of all of the NVFFs included in counter 1420, In response to the write pulse, the logical values in the flip-flop sections of all of the NVFFs are respectively written back into the memory cells in the non-volatile memory sections of the same NVFFs. Generally, the time period required for writing back the logical data into the memory cells of all NVFFs is much less than the time period required for reducing the power source voltage to the lower level.

In the embodiments described above, each one of the stages of a monotonic counter includes one or more NVFFs. However, in some embodiment, some of the stages can include other types of memory devices. For example, in counter 600, stage 610-23 only requires 2 program/erase cycles, and thus can be implemented by a memory device that can tolerate fewer program/erase cycles in its life.

According to the embodiments of the present disclosure, a monotonic counter includes a plurality of counting bits, of which at least one counting bit is implemented by a NVFF counter including a plurality of NVFFs each having two memory cells. Compared to a monotonic counter in which each counting bit is implemented by a single memory device, the number of program/erase cycles performed on the memory cells in the monotonic counter of the embodiments of the present disclosure is greatly reduced.

In addition, each one of the reading and writing processes of the monotonic counter of the embodiments of the present disclosure is only triggered by a read pulse or a written pulse, and does not need extra information such as the address of the last stored bit. Therefore, faster read and write speeds are allowed by the monotonic counter of the embodiments of the present disclosure.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A monotonic counter, comprising:
   a plurality of stages respectively corresponding to a plurality of counting bits of the monotonic counter,
   wherein at least one of the plurality of stages is a non-volatile flip-flop (NVFF) counter that includes a plurality of NVFFs, each NVFF including a pair of non-volatile memory cells, and a number of the plurality of stages is the same as a number of the plurality of counting bits of the monotonic counter,
   wherein the at least one of the plurality of stages includes:
   the plurality of NVFFs connected in series and respectively outputting a plurality of bits, an inverted output of a last one of the series-connected NVFFs being connected to a first one of the series-connected NVFFs;
   an exclusive-or (XOR) gate receiving the plurality of NVFF bits and outputting a counting bit;
   a detector connected to an output of the XOR gate to receive the counting bit output by the XOR gate and outputting a trigger signal in response to determining that the counting bit transitions from logical value "1" to "0"; and
   an increment pulse generator outputting an increment pulse to a next and higher-order stage in response to receiving the trigger signal.

2. The monotonic counter of claim 1, wherein the NVFF counter is a Johnson ring counter.

3. The monotonic counter of claim 1, wherein the pair of non-volatile memory cells are selected from resistive random access memory cells, conductive bridging random access memory cells, magnetoresistive random access memory cells, ferroelectric random access memory cells, and phase change memory cells.

4. The monotonic counter of claim 1, wherein the at least one of the plurality of stages corresponds to a least significant bit (LSB) among the plurality of counting bits of the monotonic counter.

5. The monotonic counter of claim 4, wherein a number of the plurality of NVFFs included in the at least one of the plurality of stages is determined by M divided by P, where M is a maximum number of counts that the monotonic counter is configured to count, and P is a maximum number of program/erase cycles that a NVFF can endure.

6. The monotonic counter of claim 1, wherein each one of the NVFFs includes:
   a flip-flop section including a pair of nodes having a pair of inverse logical data values; and
   a non-volatile section including the pair of non-volatile memory cells respectively connected to the pair of nodes.

7. The monotonic counter of claim 6, wherein the monotonic counter is coupled to a controller, the monotonic counter being configured to:
   in response to a write pulse issued by the controller, write the pair of inverse logical data values on the pair of nodes of the flip-flop section into the pair of non-volatile memory cells, respectively, and
   in response to a read pulse issued by the controller, read logical data values stored in the pair of non-volatile memory cells and transfer the logical data values read from the pair of non-volatile memory cells to the pair of nodes of the flip-flop section.

8. The monotonic counter of claim 1, wherein the number of the plurality of stages is m, and the number of the plurality of counting bits is m,
   for a counting bit MC[i], where i=0, 1, ..., m−1, if $2^{m-i}$ is greater than P, where P is an estimated number of program/erase cycles in a life of a NVFF, a stage corresponding to counting bit MC[i] includes $2^{m-i}/P$ NVFFs.

9. The monotonic counter of claim 1,
   wherein the plurality of stages are m stages respectively outputting m intermediate bits MC'[(m−1):0], where m is a positive odd number, and
   the monotonic counter further includes an output control circuit including at least one multiplexer, the at least one multiplexer being configured to receive an intermediate bit MC'[(m−1)/2] as a multiplexer control, and to select either one of intermediate bits MC'[i] and MC'[m−1−i] to be output as counting bit MC[i] or MC[m−1−i] of the monotonic counter based on the intermediate bit MC'[(m−1)/2], where i is an integer and 0≤i<(m−1)/2.

10. The monotonic counter of claim 9, further including:
a clock control circuit including at least one multiplexer, the at least one multiplexer being configured to receive the intermediate bit MC'[(m−1)/2] as a multiplexer control, and to selectively provide either one of intermediate bits MC'[j] and MC'[m−1−j] as an input clock of a stage that outputs an intermediate bit MC'[j+1], where j is an integer and 0≤j<(m−1−j).

11. The monotonic counter of claim 1,
wherein the plurality of stages are m stages respectively outputting m intermediate bits MC'[(m−1):0], where m is a positive even number, and
the monotonic counter further includes an output control circuit including at least one multiplexer, the at least one multiplexer being configured to receive an intermediate bit MC'[m/2] as a multiplexer control, and to select either one of intermediate bits MC'[i] and MC'[m−1−i] to be output as counting bit MC[i] or MC[m−1−i] of the monotonic counter based on the intermediate bit MC'[m/2], where i is an integer and 0≤i<m/2.

12. The monotonic counter of claim 11, further including:
a clock control circuit including at least one multiplexer, the at least one multiplexer being configured to receive the intermediate bit MC'[m/2] as a multiplexer control, and to selectively provide either one of intermediate bits MC'[j] and MC'[m−1−j] as an input clock of a stage that outputs an intermediate bit MC'[j+1], where j is an integer and 0≤j<(m−1−j).

13. A method of implementing a monotonic counter, comprising:
providing a plurality of stages respectively outputting a plurality of output bits, wherein at least one of the plurality of stages is a non-volatile flip-flop (NVFF) counter that includes a plurality of NVFFs, each NVFF including a pair of non-volatile memory cells;
providing an output bit of one of the plurality of stages as an input clock of a next and higher-order stage of the plurality of stages;
providing a pulse as an input clock of a first stage of the plurality of stages; and
providing the plurality of output bits as a plurality of counting bits of the monotonic counter,
wherein a number of the plurality of stages is the same as a number of the plurality of counting bits of the monotonic counter, and
wherein the providing a plurality of stages includes providing the at least one of the plurality of stages, which includes:
connecting the plurality of NVFFs in the at least one of the plurality of stages in series, the plurality of NVFFs respectively outputting a plurality of bits; and
providing the plurality of bits to an exclusive-or (XOR) gate, which receives the plurality of bits and outputs an output bit of the at least one of the plurality of stages.

14. The method of claim 13, wherein the providing an output bit of one of the plurality of stages as an input clock of a next and higher-order stage of the plurality of stages includes:
determining that the output bit of one of the plurality of stages transitions from logical value "1" to "0"; and
outputting an increment pulse to the next and higher-order stage.

15. The method of claim 13, wherein the providing a plurality of stages includes providing a NVFF, which includes:
providing a flip-flop section including a pair of nodes having a pair of inverse logical data values; and
providing a non-volatile section including the pair of non-volatile memory cells respectively connected to the pair of nodes.

16. The method of claim 15, further including:
receiving a write pulse from an external controller; and
writing the pair of inverse logical data values on the pair of nodes of the flip-flop section into the pair of non-volatile memory cells, respectively.

17. The method of claim 16, further including:
receiving a read pulse from the external controller;
reading logical data values stored in the pair of non-volatile memory cells; and
transferring the logical data values read from the pair of non-volatile memory cells to the pair of nodes of the flip-flop section.

18. The method of claim 13, further including:
providing an output control circuit, which receives the plurality of outputs bits and selectively outputs the plurality of output bits as the plurality of counting bits of the monotonic counter.

19. A method of implementing a monotonic counter, comprising:
providing a plurality of stages respectively outputting a plurality of output bits, wherein at least one of the plurality of stages is a non-volatile flip-flop (NVFF) counter that includes a plurality of NVFFs, each NVFF including a pair of non-volatile memory cells;
providing an output bit of one of the plurality of stages as an input clock of a next and higher-order stage of the plurality of stages;
providing a pulse as an input clock of a first stage of the plurality of stages; and
providing the plurality of output bits as a plurality of counting bits of the monotonic counter; and
providing an output control circuit, which receives the plurality of outputs bits and selectively outputs the plurality of output bits as the plurality of counting bits of the monotonic counter,
wherein a number of the plurality of stages is the same as a number of the plurality of counting bits of the monotonic counter.

* * * * *